US012195877B2

(12) United States Patent
Preti et al.

(10) Patent No.: US 12,195,877 B2
(45) Date of Patent: Jan. 14, 2025

(54) SUBSTRATE SUPPORT DEVICE FOR A REACTION CHAMBER OF AN EPITAXIAL REACTOR WITH GAS FLOW ROTATION, REACTION CHAMBER AND EPITAXIAL REACTOR (71) Applicant: LPE S.p.A., Baranzate (IT)

(72) Inventors: Silvio Preti, Baranzate (IT); Maurilio Meschia, Baranzate (IT)

(73) Assignee: LPE S.P.A., Baranzate (IT)

( * ) Notice: Subject to any disclaimer, the term of this patent is extended or adjusted under 35 U.S.C. 154(b) by 0 days.

(21) Appl. No.: 17/778,923

(22) PCT Filed: Nov. 23, 2020

(86) PCT No.: PCT/IB2020/061011
§ 371 (c)(1),
(2) Date: May 23, 2022

(87) PCT Pub. No.: WO2021/105841
PCT Pub. Date: Jun. 3, 2021

(65) Prior Publication Data
US 2022/0411961 A1   Dec. 29, 2022

(30) Foreign Application Priority Data
Nov. 25, 2019 (IT) .................. 102019000022047

(51) Int. Cl.
*C30B 25/16* (2006.01)
*C30B 25/08* (2006.01)
(Continued)

(52) U.S. Cl.
CPC .............. *C30B 25/16* (2013.01); *C30B 25/08* (2013.01); *C30B 25/12* (2013.01); *C30B 25/14* (2013.01)

(58) Field of Classification Search
CPC ......... C30B 25/16; C30B 25/08; C30B 25/12; C30B 25/14
See application file for complete search history.

(56) References Cited

U.S. PATENT DOCUMENTS 4,368,689 A * 1/1983 Jones .................... C23C 14/246
  118/712
5,695,567 A * 12/1997 Kordina .................. C30B 31/14
  118/725

(Continued)

FOREIGN PATENT DOCUMENTS

JP    AH1164113 A    3/1999
JP    A2002280318 A   9/2002
(Continued)

*Primary Examiner* — Charlee J. C. Bennett
(74) *Attorney, Agent, or Firm* — Dickinson Wright PLLC; Andrew D. Dorisio (57) ABSTRACT The device (420) is for supporting substrates in a reaction chamber of an epitaxial reactor; it comprises: a disc-shaped element (422) having a first face (422A) adapted to be upperly positioned when the device (420) is being used and a second face (422B) adapted to be lowerly positioned when the device (420) is being used, said disc-shaped element (422) being adapted to receive a gas flow (F) to rotate the device (420) about an axis (X) thereof, a substrate-supporting element (424) in a single piece with said disc-shaped element (422) and preferably adjacent to said first face (422A), and a shaft (426) coaxial to said disc-shaped element (422), in a single piece with said disc-shaped element (422) and having a first end (426A) at said second face (422B); said shaft (426) has at a second end (426 B) thereof at least a protrusion (428 A, 428B, 428C) whose rotation is adapted to be detected by a pyrometer (430) or a thermographic camera.

11 Claims, 5 Drawing Sheets (51) Int. Cl.
*C30B 25/12* (2006.01)
*C30B 25/14* (2006.01)

(56) References Cited

U.S. PATENT DOCUMENTS

| | | | | |
|---|---|---|---|---|
| 5,747,680 | A * | 5/1998 | McArthur | G01D 21/02 |
| | | | | 73/112.01 |
| 5,782,979 | A * | 7/1998 | Kaneno | C30B 25/12 |
| | | | | 118/728 |
| 5,879,462 | A * | 3/1999 | Kordina | C30B 23/02 |
| | | | | 118/725 |
| 7,186,948 | B1 * | 3/2007 | Gordon | B23K 26/123 |
| | | | | 219/121.64 |
| 8,430,965 | B2 * | 4/2013 | Kordina | H01L 21/67109 |
| | | | | 118/724 |
| 8,481,102 | B2 | 7/2013 | Hong et al. | |
| 2002/0179586 | A1 * | 12/2002 | Wengert | C23C 16/45502 |
| | | | | 219/390 |
| 2003/0188687 | A1 * | 10/2003 | Paisley | C23C 16/4584 |
| | | | | 118/730 |
| 2004/0020436 | A1 * | 2/2004 | Kaeppeler | C23C 16/46 |
| | | | | 118/724 |
| 2006/0054091 | A1 * | 3/2006 | Speciale | C30B 25/10 |
| | | | | 156/345.55 |
| 2006/0081187 | A1 * | 4/2006 | Maccalli | C23C 16/46 |
| | | | | 118/725 |
| 2006/0118048 | A1 * | 6/2006 | Maccalli | H01L 21/68714 |
| | | | | 118/728 |
| 2009/0110805 | A1 * | 4/2009 | Kaeppeler | C23C 16/466 |
| | | | | 118/712 |
| 2010/0111511 | A1 | 5/2010 | Merry et al. | |
| 2011/0143016 | A1 * | 6/2011 | Hong | C23C 16/52 |
| | | | | 427/8 |
| 2012/0285382 | A1 * | 11/2012 | Shimizu | C23C 16/4584 |
| | | | | 118/728 |
| 2013/0252404 | A1 * | 9/2013 | Krishnan | H01L 21/68792 |
| | | | | 118/712 |
| 2014/0075178 | A1 * | 3/2014 | Trethewey | G06F 9/448 |
| | | | | 713/100 |
| 2016/0312382 | A1 * | 10/2016 | Corea | C30B 25/08 |
| 2019/0256999 | A1 * | 8/2019 | Ogliari | C23C 16/52 |
| 2021/0189594 | A1 * | 6/2021 | Ogliari | H05B 6/108 |
| 2022/0074048 | A1 * | 3/2022 | Preti | C23C 16/4586 |

FOREIGN PATENT DOCUMENTS

| | | |
|---|---|---|
| WO | 2004053187 A1 | 6/2004 |
| WO | 2004053188 A1 | 6/2004 |
| WO | 2004053189 A1 | 6/2004 |
| WO | 2005121417 A1 | 12/2005 |
| WO | 2015092525 A1 | 6/2015 |

* cited by examiner

SUBSTRATE SUPPORT DEVICE FOR A REACTION CHAMBER OF AN EPITAXIAL REACTOR WITH GAS FLOW ROTATION, REACTION CHAMBER AND EPITAXIAL REACTOR

FIELD OF THE INVENTION

The present invention relates to a substrate support device for a reactor chamber of an epitaxial reactor adapted to deposit semiconductor material on a substrate, as well as to a reaction chamber and epitaxial reactor using such device.

In particular though not exclusively, the present invention relates to a "hot-wall" reaction chamber, i.e. wherein the walls are intentionally kept hot and often especially heated. On the contrary, in a "cold-wall" reaction chamber, the walls are intentionally kept cold for instance by means of cooling gas flows and/or cooling liquid flows.

Such type of reaction chamber is mainly used for the epitaxial deposition of silicon carbide on a silicon carbide substrate ("homoepitaxial" process) or on a substrate made of another material ("heteroepitaxial" process).

STATE OF THE ART

In order to make the layer of deposited material uniform, rotation is, among other things, often used: in the reaction chamber a device is arranged to support (directly or not) substrates, one or more substrates are placed on the device and, at least during the deposition processes, the device is rotated.

It is important that the rotation speed of the device, and therefore of substrates, is predetermined and constant over time at least during the deposition processes.

There are reaction chambers, in particular "hot-wall" reaction chambers, wherein the rotation of the substrate support device is obtained by means of a gas flow pushing on the device (and not by means of a rotating shaft mechanically coupled to the device); solutions of this type are for instance illustrated and disclosed in the five International Patent Applications by the Applicant WO2004053187A1, WO2004053188A1, WO2004053189A1, WO2005121417A1 and WO2015092525A1 herein incorporated for reference.

In this case, i.e. in case of fluid-dynamic rotation, the estimate of the rotation speed of the device based on the flow rate of the gas flow is not precise as there are several factors affecting the rotation speed and that cannot be determined or measured. For example, the rotation speed can be affected by the deposits accumulating over time on the device for supporting substrates and/or by the positioning and change of positioning of the device for supporting substrates.

Obviously, if a mechanical rotation was used, i.e., obtained by means of a motor external to the reaction chamber transmitting a rotary movement to the device for supporting substrates by a shaft, the rotation speed would be known and controlled with precision, but the solution would be more complex both in terms of composition construction and in terms of assembling/disassembling.

SUMMARY

The general object of the present invention is to overcome such problem, i.e. estimating (in particular estimating with high precision, i.e. determining) the rotation speed of a device for supporting substrates, in particular in a reaction chamber with gas flow rotation.

Such a problem is particularly difficult as the device is inside a reaction chamber, precisely in a central zone of the reaction chamber, which, during the processes, is at a very high temperature; in the case of silicon epitaxial deposition the temperature may be for example of 800-1200° C. and in the case of silicone carbide epitaxial deposition the temperature may be for instance of 1600-3000° C.

This general object and other more specific objects are reached thanks to what is expressed in the appended claims that form an integral part of the present description.

It is object of the present invention a substrate support device as well as a reaction chamber and an epitaxial reactor using such device.

LIST OF FIGURES

The present invention shall become more readily apparent from the detailed description that follows to be considered together with the accompanying drawings in which:

FIGS. 6-1 to 6-4 show temperature trends over time according to various direction settings of a pyrometer of the present invention As can be easily understood, there are various ways of practically implementing the present invention which is defined in its main advantageous aspects in the appended claims and is not limited either to the following detailed description or to the appended claims.

DETAILED DESCRIPTION

The present invention relates, in particular though not exclusively, to a reaction chamber with gas flow rotation.

The present invention relates, in particular though not exclusively, to a "hot-wall" reaction chamber.

The Applicant has already dealt with reaction chambers of this type and has filed, for example, the five previously mentioned International Patent Applications herein incorporated for reference.

Figure 1:
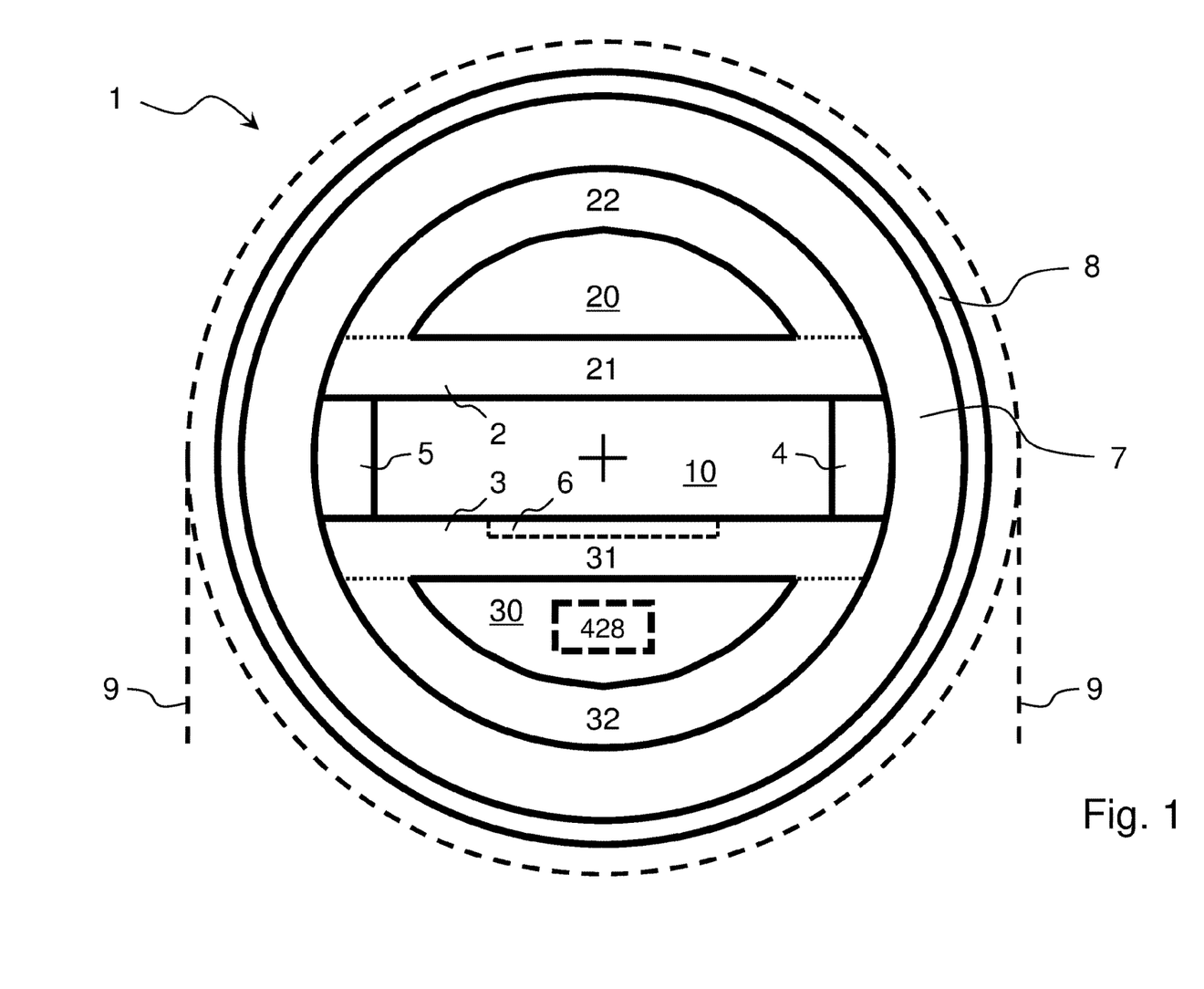
FIG. 1 shows a cross section (schematic) view of a reaction chamber.
Figure 2:
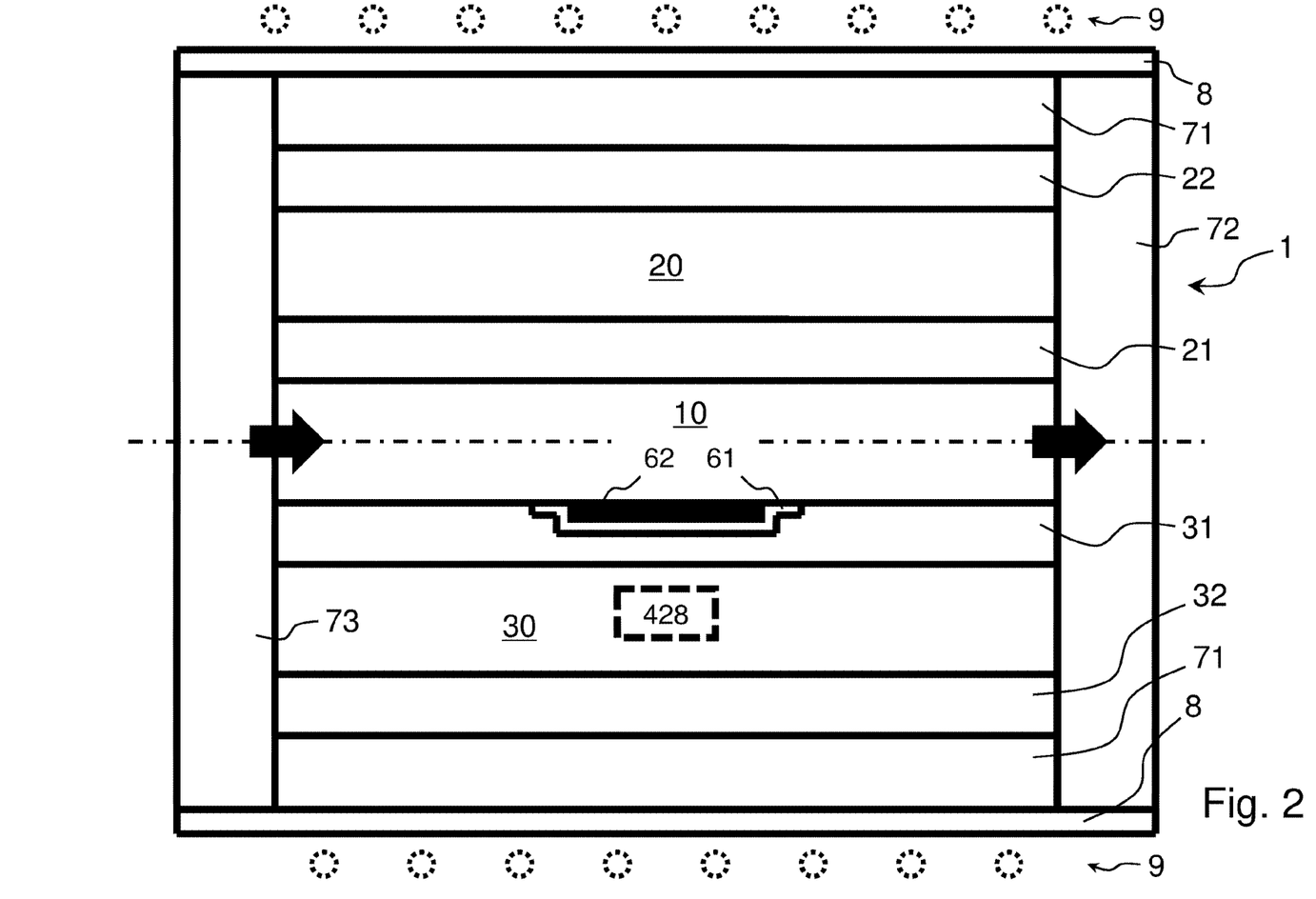
FIG. 2 shows a longitudinal sectional (schematic) view of the reaction chamber of FIG. 1.
Figure 3:
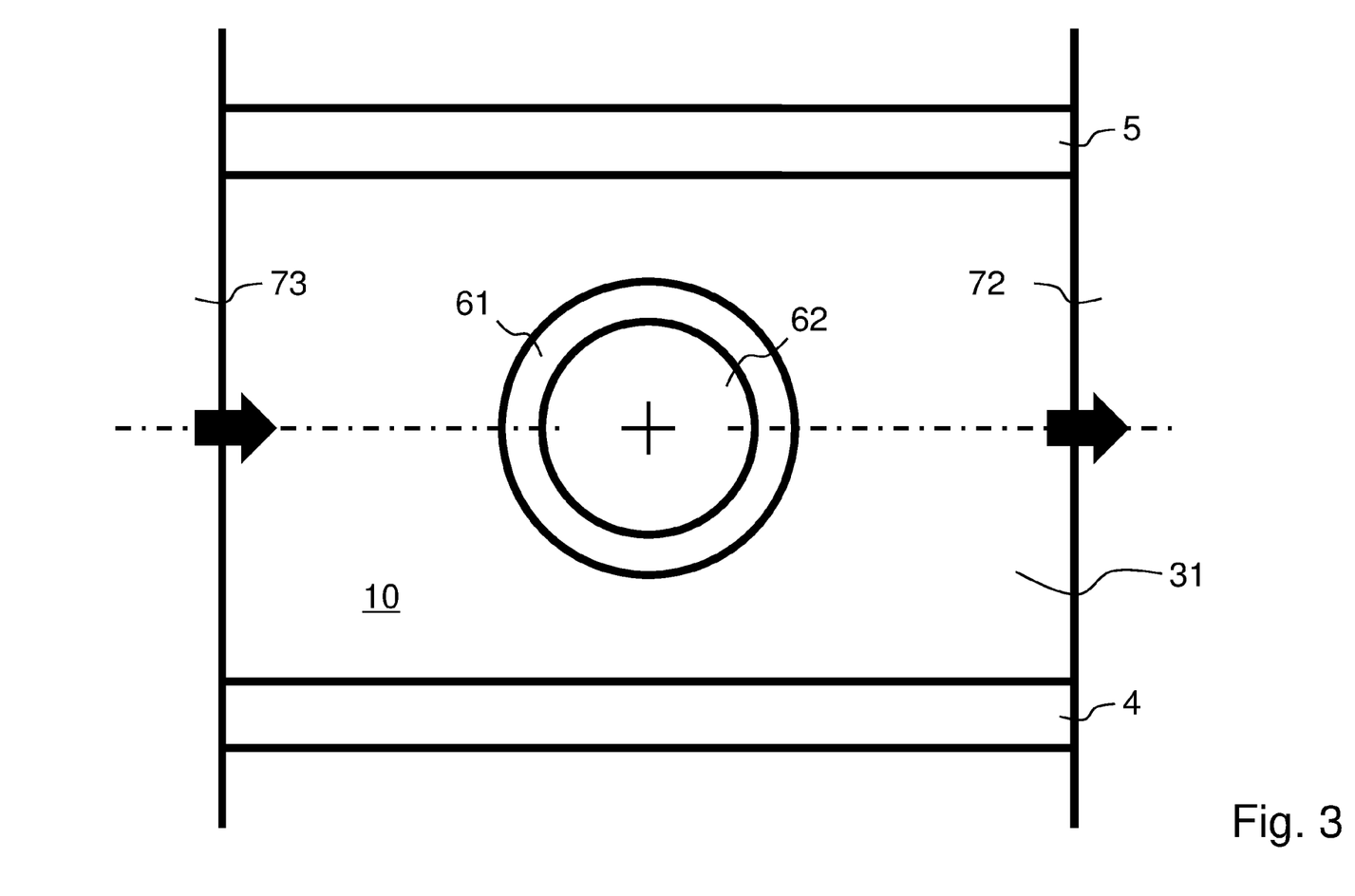
FIG. 3 shows an internal (schematic) view from above of part of the reaction chamber of FIG. 1.

An example of a reaction chamber 1 of this type is illustrated schematically in FIG. 1 and FIG. 2 and FIG. 3; it extends uniformly along a longitudinal direction. It comprises a susceptor assembly consisting of four susceptor elements 2, 3, 4 and 5 that define a reaction and a deposition zone 10 and that are contained in a casing 7 made of heat insulating material; the casing 7 is inserted in a quartz tube 8. The casing 7 consists of a tube 71 (in particular with a circular section) and two caps 72 and 73 (in particular circular-shaped as the tube section). Around the tube 8, an inductor 9 is wrapped, being adapted to heat by electromagnetic induction the elements 2, 3, 4 and 5 which are made of graphite; the inductor 9 is represented with a broken line because it is not strictly part of the reaction chamber 1. The elements 4 and 5 are two slats (which can be considered as walls of the reaction chamber) and constitute the side walls of the zone 10. The elements 2 and 3 are projection solids with a section having the shape of a circular segment and with a pass-through hole 20 and 30 with a section having the shape of a circular segment; hence, they consist of a plane slab 21 and 31 (which can be considered as inner walls of the reaction chamber) and a curved slab 22 and 32 (which can be considered as outer walls of the reaction chamber); the plane slabs 21 and 31 constitute respectively the upper and lower walls of the zone 10. The lower wall 31 is adapted to house an assembly 6 that comprises, among other things, a support element 61 (rotatable during the deposition processes) adapted to support at least one substrate 62 subject to deposition placed in a recess of the element; according to this example, the support element 61 can be inserted and extracted out of the zone 10. The two caps 72 and 73 are shown as though they were closed; however, they have openings, in particular an opening in the cap 73 for the inlet of precursor gases (see the black arrow) and an opening in the cap 72 for the outlet of exhaust gases (see the black arrow); furthermore, as will be more evident from the following, there might be openings for a tube adapted to flow rotation gas and for electric cables adapted to conduct electric signals for example of a pyrometer and of a temperature sensor (inside the reaction chamber).

With reference to FIG. 1 and FIG. 2 and FIG. 3, if the inductor 9 is supplied with an alternating current, alternating electrical currents are induced in the susceptor elements 2, 3, 4 and 5, especially in the elements 2 and 3 (it is to be noted that elements 4 and 5 could also be made in full or in part, of electrically insulating material and therefore provide a low contribution to the heating of the reaction and deposition zone 10). The most typical material for making the susceptor elements is graphite; this can be used bare or covered, for example, covered in silicon carbide or tantalum carbide.

The reaction chamber 1 of FIG. 1 and FIG. 2 and FIG. 3 is suitable for many variants, for example: having a differently-shaped section (polygonal, elliptical, . . . ), having an upper susceptor element with no pass-through hole, having side susceptor elements with pass-through holes, having a substrate support element adapted to support directly a certain number of substrates, . . . .

In FIG. 1 and FIG. 2, a broken line box associated to reference number 428 is visible to schematically indicate the presence of a substrate support device according to the present invention.

Figure 4:
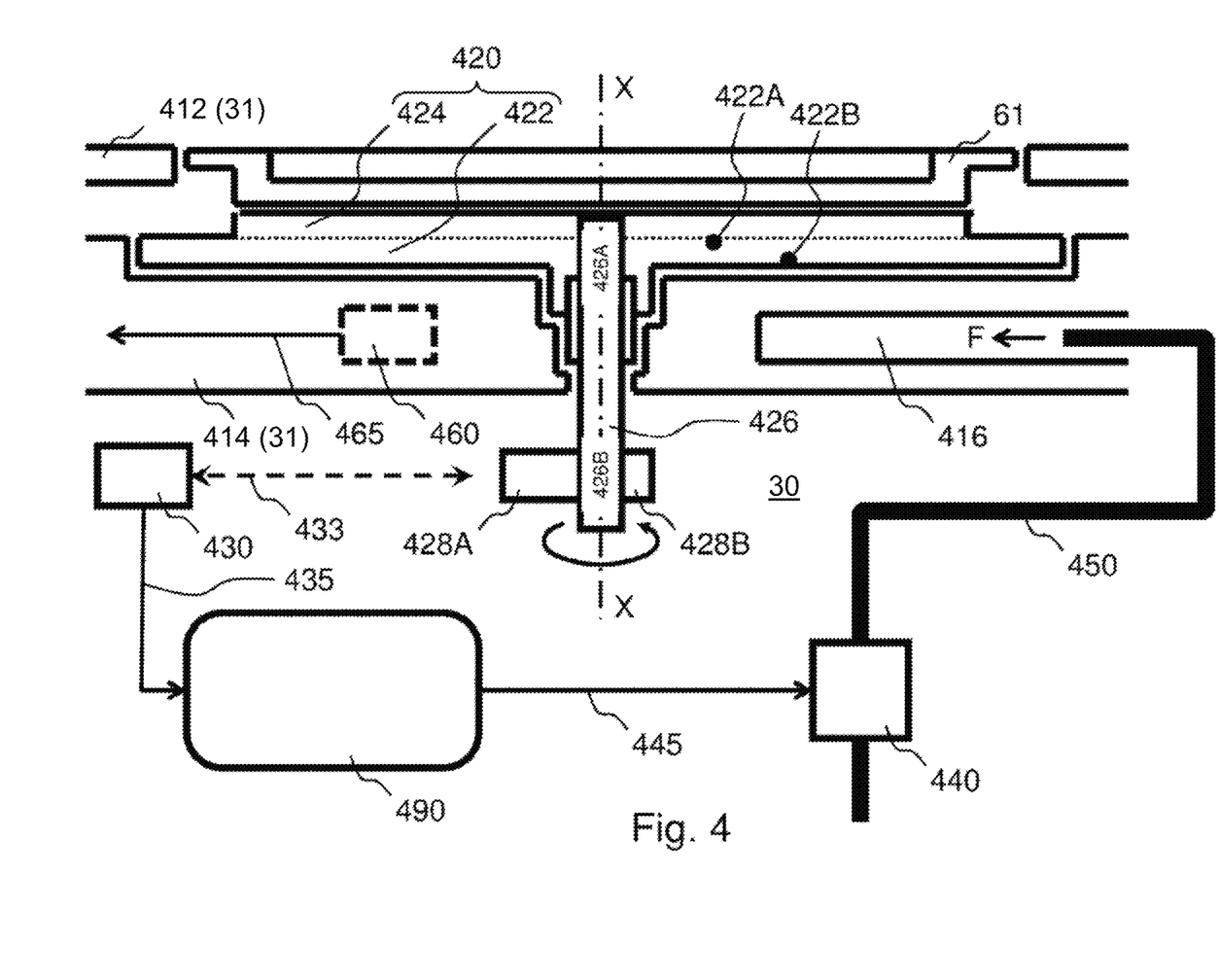
FIG. 4 shows a longitudinal sectional partial and detailed view of the reaction chamber of FIG. 1 in which an embodiment of a substrate support device according to the present invention is well visible.

A possible conformation of the assembly 6 will be clear from the following description and from FIG. 4.

It is to be noted that in FIG. 4, the support element 61 is shown according to a non-limiting embodiment thereof. Conceptually, such element may be described by a set of parts as follows. It comprises a plate part, simply called "plate", having a circular shape and having a support, surface adapted to support a substrate; in particular, the support surface substantially has the same shape and size as the substrate and constitutes the bottom of a recess of the element. It further comprises a first part of edge which entirely surrounds the plate and that extends axially such to constitute the side wall of the recess of the element. It finally comprises a second part of the edge which entirely surrounds the first part of edge and that extends radially; it can be stated that the second part of edge is a flange located around the first part of edge. The parts herein above disclosed may be joined to form one or more single pieces. Each one of the herein above disclosed parts may be formed by two or more single pieces mechanically coupled between them.

Though not highlighted in the figures (with the exception of FIG. 4), the reaction chamber and the epitaxial reactor of the figures implement the rotation of the device to support gas flow substrates.

As previously stated, the general object of the present invention is estimating, or even determining, the rotation speed of a device for supporting substrates (for instance the device indicated as a whole with reference 420 in FIG. 4).

The general idea for reaching this object is to use an optical-thermal device, in particular a thermographic camera or, more advantageously, a pyrometer (for example the device indicated by reference 430 in FIG. 4).

In fact, for instance and in particular a pyrometer (e.g. the element indicated by reference number 430 in FIG. 4) may be used to estimate or determine the rotation speed of a device for supporting substrates (for example the element indicated by reference number 420 in FIG. 4) in a reaction chamber of an epitaxial reactor; such use provides:

maintaining the pyrometer in a constant direction (for example the direction indicated by reference 433 in FIG. 4) while the device rotates such that the temperature detected by the pyrometer is subject to a periodic variation (see for example plots of FIG. 6-2, FIG. 6-3 and FIG. 6-4) due to the device rotation, and that the rotation speed is calculated by a processing electronic unit (for example the element indicated by reference 490 in FIG. 4) electrically connected to the pyrometer based on the period of the periodic variation.

Such idea was advantageously implemented in a reaction chamber with gas flow rotation, in particular a reaction chamber of the "hot wall" type and/or by epitaxial deposition of silicon carbide.

Reference will be made hereinafter to the embodiment of FIG. 4, but such reference is not to be considered as limiting.

In order to take advantage of such general idea, the device 420 for supporting substrates in a reaction chamber of an epitaxial reactor is configured in a particular way; in the embodiment of FIG. 4 the device 420 indirectly supports the substrates thanks to the support element 61; it specifically comprises:

a disc-shaped element 422 having a first face 422A adapted to be upperly positioned when the device 420 is being used and a second face 42213 adapted to be lowerly positioned when the device 420 is being used; the disc-shaped element 422 is adapted to receive a gas flow F to rotate the device 420 (exactly or substantially) about an axis X thereof, a substrate-supporting element 424 in a single piece with the disc-shaped element 422 and preferably adjacent to the first face 422A, a shaft 426 coaxial to the disc-shaped element 422, in a single piece with said disc-shaped element 422 and having a first end 426A at (at least) said second face 422B. The shaft 426 has at a second end 426B thereof at least a protrusion 428A, 428B, 428C whose rotation is adapted to be detected by a pyrometer 430 or a thermographic camera. As is shown in FIG. 4, the element 422 and element 424 may be integrated to form a single piece.

As is shown in FIG. 4, the shaft 426 may be integrated with element 422 and element 424. As is shown in FIG. 4, the first end 426A of the shaft 426 is at both the element 422 and element 424. Furthermore, even if in the example of FIG. 4 the element 422 consists of a circular disc almost perfectly plane and provided with a central hole, it is possible, as an alternative, that instead of the central hole, the element 422 has a central protrusion (e.g. a cylindrical protrusion) adapted to mechanically couple with the shaft 426; in this case, the first end 426A of the shaft. 426 is at the central protrusion of the element 422.

As described and illustrated in the five International Patent Applications previously mentioned, the disc-shaped element 422 may have recesses at the back adapted to receive the gas flow F.

The rotation of the at least a protrusion is preferably adapted to be detected through a pyrometer 430.

The shaft 426 may have two protrusions or three protrusions at one second end 426B thereof; preferably, the shaft 426 may have three protrusions 428A, 428B, 428C (in particular arranged radially at 120° from each other); their rotation is adapted to be detected through the pyrometer 430 or a thermographic camera; such protrusions are preferably equal between them.

The at least a protrusion may be a plate (in particular rectangular-shaped and typically substantially plane) extending perpendicularly to an axis X of the shaft 426.

Preferably, the device 420 is completely made of graphite; in particular, both the element 422 and the element 424 and the shaft 426 are made of graphite.

The shaft 426 may be mechanically and directly fixed to the disc-shaped element 422; for example, such fixing may be made by a screw, by a tongue-keyway coupling or by snap-fitting.

The at least a protrusion is fixed mechanically and directly to the shaft 426; for example, the at least a protrusion may be inserted into a shaft hole; alternatively, the at least a protrusion may be integrated in an element to be screwed on the shaft.

The device 420 may comprise a protection socket 427 surrounding the shaft 426 for a portion thereof (in particular at a hole in the wall 31 of the reaction chamber). Such socket 427 serves as a low-friction rotatable guide and may be considered a consumable.

The substrate supporting device according to the present invention, in particular the device 420 of FIG. 4, is typically a component of a reaction chamber of an epitaxial reactor (i.e. for epitaxial deposition of layers of semiconductor material on substrates).

Such an application is particularly advantageous for reaction chambers provided with a gas rotation system of the substrate-supporting device.

In this case, the disc-shaped element 422 of the device 420 may be housed rotatable in a seat of a chamber wall; in the example of FIG. 4, the wall 31 has such seat, in particular a slab 414 has the seat.

The wall 31 of FIG. 4 comprises a slab 414 and a covering or lining 412; an inner duct 416 is obtained in the slab 414 to let the rotation gas flow and lead it to the element 422 rear portion; in the slab 414 a temperature measuring device 460 connected to an electric cable 465 is also inserted.

As shown in FIG. 4, the seat of the wall 31 has advantageously a pass-through hole which is passed through by the shaft 426 of the device 420; thereby, the at least a protrusion 428 may be located inside a hole of an element of the reaction chamber (see for instance the hole 30 of the element 3 of the chamber 1 in FIG. 1 and FIG. 2).

Advantageously, the wall for the seat for the substrate-supporting device is an inner wall (see for instance the wall 31 of the chamber 1 in FIG. 1), i.e. a wall which does not define the outer perimeter of the reaction chamber.

Advantageously, in use the at least a rotatable protrusion of the shaft 426 of the device 420 is in a cavity of the chamber, in particular between an inner wall (i.e. a wall not defining the outer perimeter of the reaction chamber) and an outer wall (i.e. a wall defining at least partially the outer perimeter of the reaction chamber) of the chamber; in the example of FIG. 1 and FIG. 4, the inner wall is the wall 31 and the outer wall is the wall 32.

As previously stated, the present invention requires a thermographic camera or preferably a pyrometer oriented such to detect the shaft rotation of the device, or better the rotation of the at least a shaft protrusion; the thermographic camera or the pyrometer (for instance that indicated by 430 in FIG. 4) may be considered part of the reaction chamber according to the present invention.

According to the exemplary embodiment of FIG. 4 (this figure shows some components of an embodiment of an epitaxial reactor according to the present invention) the epitaxial reactor comprises a control electronic unit 490 electrically connected (see the electric cable 435) and a thermographic camera or preferably a pyrometer 430 of the reaction chamber, and adapted to estimate or determine a rotation speed of the substrate-supporting device 420 of the reaction chamber based on electrical signals received by the thermographic camera or by the pyrometer 430. It is worth observing that in FIG. 4 the light rays seem to exit/enter directly from/into the pyrometer 430; however, it must not be excluded that the pyrometer or the thermographic camera is optically connected to an optic fibre.

Furthermore, always according to the embodiment of FIG. 4, the control electronic unit 490 may be advantageously connected electrically (see the electric cable 445) to a regulator, in particular a Mass Flow Controller 440, of the reaction chamber, and it is adapted to set a rotation gas flow based on the estimated or determined rotation speed; obviously the regulator, in particular a Mass Flow Controller 440 is fluidically connected to the duct 416 for instance by a tube 450.

According to the present invention, in order to determine the rotation speed of a substrate-supporting device, the pyrometer (or possibly the thermographic camera) must be suitably directed towards the rotatable protrusion or the rotatable protrusions, if more than one; with reference to FIG. 4, the pyrometer 430 must be suitably directed towards the rotatable protrusions 428 which, specifically, are in number of three and radially arranged at 120° from each other; it is a fixed and pre-determined direction setting.

Figure 5:
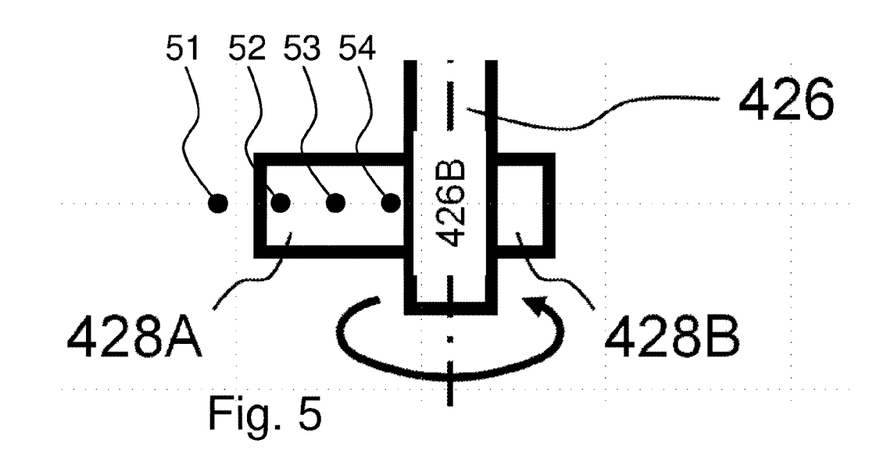
FIG. 5 shows a possible time trend of an electrical signal generated by a pyrometer shown in FIG. 4.
Figure 61:
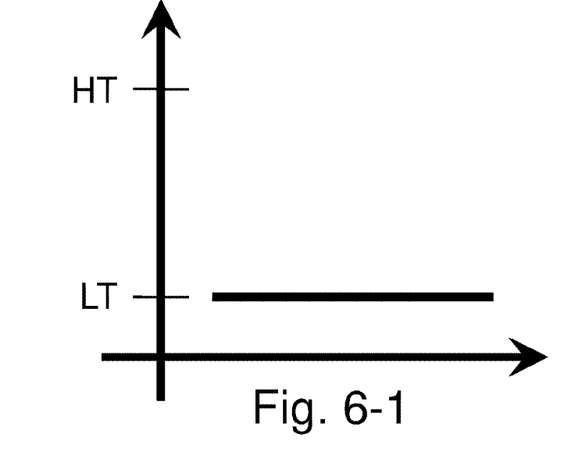

In order to understand the concept of "suitably" reference can be made to FIG. 5 and FIG. 6.

In FIG. 5, 4 different direction settings of the pyrometer 430 are exemplified. According to the first direction setting, the pyrometer is directed towards a point 51 of the cap 72 of the casing 7 and the straight line (433 in FIG. 4) between the pyrometer 430 and the point 51 is never intercepted by protrusions 428. According to the second direction setting, the pyrometer is directed towards a point 52 of the cap 72 of the casing 7 and the straight line (433 in FIG. 4) between the pyrometer 430 and the point 52 is intercepted by the protrusions 428 at a zone thereof (or very far away) from the rotation axis. According to the third direction setting, the pyrometer is directed towards a point 53 of the cap 72 of the casing 7 and the straight line (433 in FIG. 4) between the pyrometer 430 and the point 53 is intercepted by the protrusions 428 at an intermediate zone thereof. According to the fourth direction setting, the pyrometer is directed towards a point 54 of the cap 72 of the casing 7 and the straight line (433 in FIG. 4) between the pyrometer 430 and the point 54 is intercepted by the protrusions 428 at a zone thereof that is close (or very close) to the rotation axis.

In FIG. 6, they are shown, for exemplary purposes, time trends of the temperatures that are read, i.e. detected (for example every 10-100 mS), by the pyrometer 430; we might suppose that the protrusions 428 are at a high temperature (for instance 1200-1600° C.) and that the cap 72 of the casing 7 of thermally insulating material is at a low temperature LT (for instance 400-800° C.). FIG. 6-1 shows the temperature trend over time when the pyrometer is according to the first direction setting; it is a straight and horizontal line. FIG. 6-2 shows the temperature trend over time when the pyrometer is according to the second direction setting; it is a set of peaks that are narrow and distant from each other. FIG. 6-3 shows the temperature trend over time when the pyrometer is according to the third direction setting; it is a line looking like a sine curve of a large width and equal to about (HT-LT)/2. FIG. 6-4 shows the temperature trend over time when the pyrometer is according to the fourth direction setting; it is a line looking like a sine curve of a small width.

Figure 62:
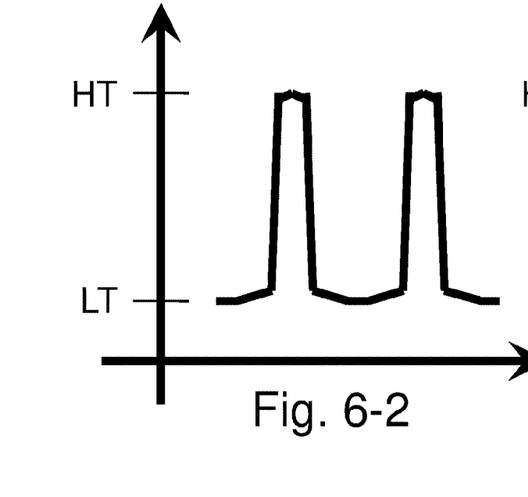
Figure 63:
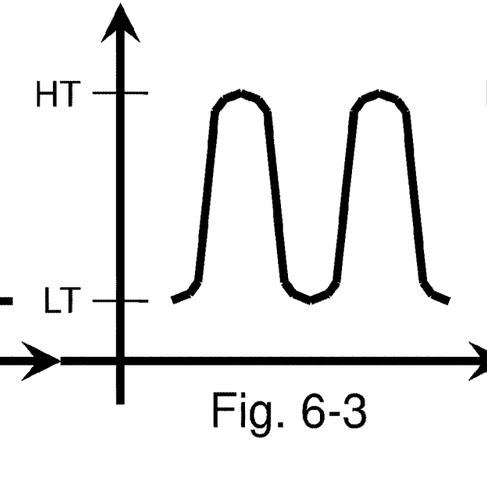
Figure 64:
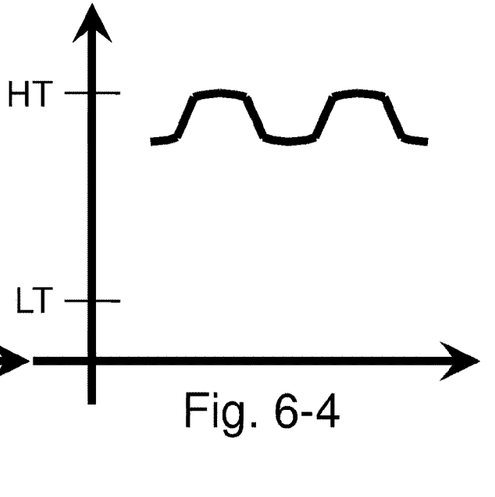

It is understood that it is possible to obtain from the periodic trends of FIG. 6-2, FIG. 6-3 and FIG. 6-4 the rotation speed of the substrate-supporting device 420, and that the first direction setting does not allow to estimate or determine the rotation speed. The ideal direction setting for estimating or determining the rotation speed is the third direction setting, i.e. the one wherein, while protrusions 428 rotate, the straight line between the pyrometer 430 and the point 53 is intercepted for a time range from a zone of the protrusions 428 which is intermediate between the tip thereof (far from the rotation axis) and the base thereof (close to the rotation axis). Estimating or determining the rotation speed (which can for example be of 10-100 rpm) involves estimating or determining the period of the time range of the temperature and it can be made by processing, in a known way, the pyrometer signal in the time or frequency domain and digitally and/or in an analogue way.

It is understood from the above that, in the step of assembling the reaction chamber, the pyrometer preferably requires adjusting its direction setting.

It must be noted that in case a thermographic camera is used rather than a pyrometer, processing the signal may be much more complicated, though the direction setting may be less critical.

The invention claimed is:

1. A reaction chamber for an epitaxial reactor, comprising:-a susceptor element (3) comprising a curved slab (32) and a plane slab (31) forming a cylindrical body with a pass-through hole (30) along a longitudinal axis thereof,-a device for supporting substrates in the reaction chamber, the device comprising a disc-shaped element (422) having a first face (422A) adapted to be upperly positioned when the device is being used and a second face (422B) adapted to be lowerly positioned when the device is being used, said disc-shaped element (422) being adapted to receive a gas flow to rotate the device about an axis thereof, a substrate support element (424) in a single piece with said disc-shaped element (422) and adjacent to said first face (422A), a shaft (426) defining an axis (X) of the shaft in a longitudinal direction, the shaft (426) coaxial to said disc-shaped element (422), in a single piece with said disc-shaped element and having a first end (426A) at said second face (422B);

wherein said shaft (426) has at a second end (426B) thereof at least a protrusion (428A) whose rotation is adapted to be detected by a pyrometer (430) or a thermographic camera, and wherein the shaft (426) crosses the plane slab (31) of the susceptor element (3) and the protrusion (428A) is located inside the pass-through hole (30);

wherein the longitudinal direction of the axis (X) of the shaft extends transverse to a longitudinal axis of the pass-through hole (30) of the susceptor element (3);

wherein the disc-shaped element is rotatably housed in a seat of the plane slab (31): and wherein the plane slab (31) has an inner duct (416) within the plane slab (31) adapted to let flow the gas flow to rotate said device for supporting substrates.

2. The reaction chamber according to claim 1, wherein the rotation of said at least a protrusion is adapted to be detected by a pyrometer.

3. The reaction chamber according to claim 1, wherein said shaft has two protrusions or three protrusions or four protrusions at a second end thereof whose rotation is adapted to be detected by a pyrometer or by a thermographic camera, said protrusions being equal between them.

4. The reaction chamber according to claim 1, wherein said at least a protrusion is a plate extending perpendicularly to an axis of the shaft.

5. The reaction chamber according to claim 1, wherein the disc-shaped element, the substrate support, and the shaft are entirely made of graphite.

6. The reaction chamber according to claim 1, wherein said shaft is mechanically fixed to said disc-shaped element.

7. The reaction chamber according to claim 1, wherein said protrusion is mechanically fixed to said shaft.

8. The reaction chamber according to claim 1, comprising a protection socket surrounding said shaft for a portion thereof.

9. The reaction chamber according to claim 1, wherein said seat plane slab has a pass-through hole traversed by the shaft of said device.

10. The reaction chamber of claim 1, comprising a control electronic unit electrically connected to the thermographic camera or a pyrometer, and adapted to estimate or determine a rotation speed of a substrate-supporting device of said reaction chamber based on electrical signals received from said thermographic camera or from said pyrometer.

11. The reaction chamber of claim 10, wherein said control electronic unit is electrically connected to a Mass Flow Controller of said reaction chamber and is adapted to set a rotation gas flow based on said estimated or determined rotation speed.

* * * * *